(12) United States Patent
Lee

(10) Patent No.: US 7,352,241 B2
(45) Date of Patent: Apr. 1, 2008

(54) VARIABLE GAIN AMPLIFIER

(75) Inventor: Jeong-ho Lee, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 149 days.

(21) Appl. No.: 11/234,112

(22) Filed: Sep. 26, 2005

(65) Prior Publication Data

US 2006/0071712 A1    Apr. 6, 2006

(30) Foreign Application Priority Data

Oct. 4, 2004    (KR) ...................... 10-2004-0078747

(51) Int. Cl.
*H03F 3/45* (2006.01)
*H03G 3/00* (2006.01)
(52) U.S. Cl. ...................... 330/254; 330/278
(58) Field of Classification Search ................ 330/254, 330/278
See application file for complete search history.

(56) References Cited

U.S. PATENT DOCUMENTS

| 6,476,675 | B1 | 11/2002 | Sun |
| 6,538,512 | B2 | 3/2003 | Sun |
| 6,657,491 | B2* | 12/2003 | Fanous et al. .......... 330/124 R |
| 7,116,949 | B2* | 10/2006 | Irie et al. .................... 455/118 |
| 2003/0218502 | A1* | 11/2003 | MacTaggart et al. ....... 330/254 |

FOREIGN PATENT DOCUMENTS

| JP | 4-74009 A | 3/1992 |
| JP | 4-74010 A | 3/1992 |
| JP | 4-120908 A | 4/1992 |
| JP | 2003-243951 A | 8/2003 |
| WO | WO 99/03197 A2 | 1/1999 |

* cited by examiner

*Primary Examiner*—Robert Pascal
*Assistant Examiner*—Alan Wong
(74) *Attorney, Agent, or Firm*—Sughrue Mion, PLLC

(57) ABSTRACT

A variable gain amplifier is provided. The variable gain amplifier includes a first cascode amplifier which includes a first common source transistor and a first common gate transistor, a second cascode amplifier which forms a differential pair with the first cascode amplifier and includes a second common source transistor and a second common gate transistor, and a gain adjustment unit having a side connected to the drain of the first common source transistor and the source of the first common gate transistor and another side connected to the drain of the second common source transistor and the source of the second common gate transistor.

11 Claims, 14 Drawing Sheets

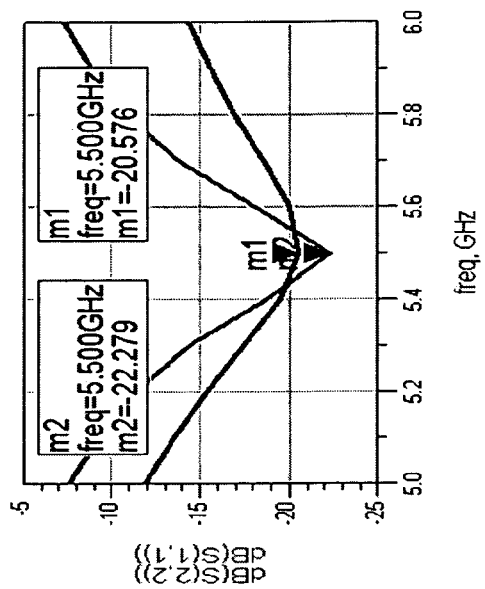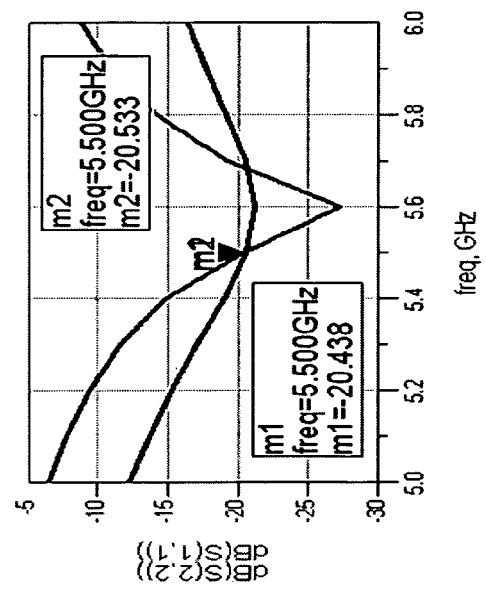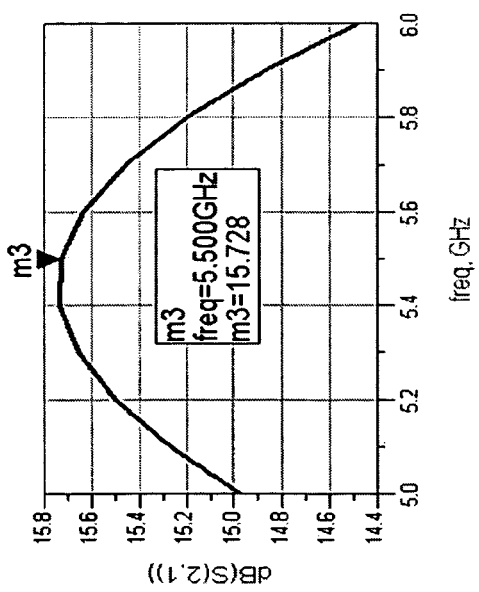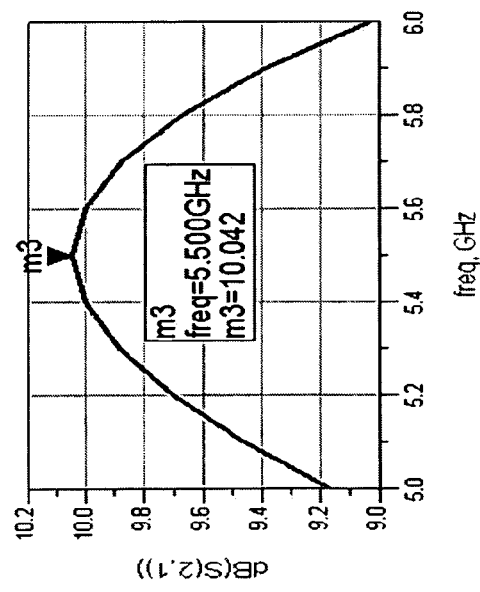
FIG. 5B
FIG. 5D
FIG. 5A
FIG. 5C

VARIABLE GAIN AMPLIFIER

CROSS-REFERENCE TO RELATED APPLICATION

This application claims priority from Korean Patent Application No. 10-2004-0078747 filed on Oct. 4, 2004 in the Korean Intellectual Property Office, the disclosure of which is incorporated herein by reference in its entirety.

BACKGROUND OF THE INVENTION

1. Field of the Invention

The present invention relates to a variable gain amplifier, and more particularly, to a variable gain amplifier having stable input/output matching characteristics.

2. Description of the Related Art

In transmitting a signal using a wireless communication apparatus, in order to maintain the power of a signal output via an antenna constant, or to provide a signal received via the antenna with an appropriate gain according to the intensity of the received signal, the wireless communication apparatus needs a variable gain amplifier.

FIG. 1 is a circuit diagram of an exemplary wireless communication apparatus including a variable gain amplifier.

The operation of the wireless communication apparatus associated with the transmission of signals will now be described in detail with reference to FIG. 1.

Referring to FIG. 1, a baseband signal output from a baseband processor 190 is amplified by a baseband amplifier 140. The amplified baseband signal is mixed with an oscillation signal generated by an oscillator 180 by an up-mixer 130, thereby generating a radio frequency (RF) signal. Known communication systems convert a baseband signal into an intermediate frequency (IF) signal and then convert the IF signal into an RF signal instead of directly converting a baseband signal into an RF signal. The RF signal generated by the up-mixer 130 is amplified by a power amplifier (PA) 120, and the amplified RF signal is output via an antenna 110. The power amplifier 120 may comprise multiple-stage amplifiers to achieve a high gain while reducing distortion. For example, the wireless communication apparatus may include a pre-power amplifier and a power amplifier.

The operation of the wireless communication apparatus associated with the reception of signals will now be described in detail.

An RF signal is received via the antenna 110 and then is amplified by a low noise amplifier (LNA) 150. The amplified RF signal is converted into a baseband signal by a down-mixer 160, and the baseband signal is amplified by a baseband amplifier 170. Conventional communication systems convert an RF signal into an intermediate frequency (IF) signal and then convert the IF signal into a baseband signal instead of directly converting an RF signal into a baseband signal. The amplified baseband signal is transmitted to a baseband processor 190. The low noise amplifier 150, like the power amplifier 120, may comprise a plurality of amplifiers to achieve a sufficiently high gain.

A switch 115 prevents the RF signal output from the power amplifier 120 from being input to the low noise amplifier 150 and prevents the RF signal received via the antenna 110 from being transmitted to the power amplifier 120. A duplexer rather than the switch 115 may be used in a full-duplex communication system.

In short, a power amplifier (PA) or a low noise amplifier (LNA) used in a wireless communication apparatus must provide a sufficiently high gain. In this regard, Japanese Patent Publication No. 2003-243951 discloses a variable gain amplifier having means for varying impedance. In detail, the variable gain amplifier includes an impedance variation unit located between the collectors of a differential pair of bipolar transistors. However, the variable gain amplifier has a small gain adjustment range and shows unstable input/output matching characteristics especially when being used as a high frequency circuit.

FIG. 2 is a circuit diagram of an example of a conventional variable gain amplifier having a wide gain adjustment range.

Referring to FIG. 2, the variable gain amplifier has a differential cascode amplifier structure including a differential pair of cascode amplifiers, i.e., first and second cascode amplifiers, and also has an LC matching structure for input/output matching.

The first cascode amplifier includes a common source transistor 211 and a common gate transistor 221, and the second cascode amplifier includes a common source transistor 212 and a common gate transistor 222.

A bias voltage VG1 and a positive signal (+) input via a signal input terminal are applied to the gate of the common source transistor 211. The common source transistor 211 improves the frequency response characteristics of the first cascode amplifier. The positive signal (+) passing through the first cascode amplifier is output via an output terminal Out+. For input matching, a capacitor and an inductor are connected to the signal input terminal through which the positive signal (+) is received.

Likewise, the bias voltage VG1 and a negative signal (−) input via a signal input terminal are applied to the gate of the common gate transistor 222. The common gate transistor 222 improves the frequency response characteristics of the second cascode amplifier. The negative signal (−) is output from the second cascode amplifier via an output terminal Out−. For input matching, a capacitor and an inductor are connected to the signal input terminal through which the negative signal (−) is received.

A gain adjustment unit 231 includes two transistors that serve as switches and a resistor. The turning on or off of the two transistors is controlled by a gate voltage Vcont applied to the two transistors. Inductors 241 and 242 are used for output matching.

FIGS. 3A-3D illustrates the variations of the values of S-parameters S11, S21, and S22 indicating the input/output matching characteristics of the conventional variable gain amplifier shown in FIG. 2.

Specifically, FIGS. 3A and 3B illustrate the variations of the values of the S-parameters S11, S21, and S22 in a high gain mode, and FIGS. 3C and 3D illustrate the variations of the S-parameters S11, S21, and S22 in a low gain mode.

In a high gain mode, the S-parameter S11 indicating input matching characteristics has a value of −22.279 dB, and the S-parameter S22 indicating output matching characteristics has a value of −20.576 dB. Given that a variable gain whose input/output matching properties are lower than −15 dB is generally considered desirable, it appears that the conventional variable gain amplifier shown in FIG. 2 has desirable input/output matching characteristics in the high gain mode.

On the other hand, in the low gain mode, the S-parameter S11 has a value of −23.193 dB, and the S-parameter S22 has a value of −7.082 dB. Thus, the conventional variable gain amplifier shown in FIG. 2 is also considered desirable in the low gain mode in terms of input matching characteristics. However, the conventional variable gain amplifier shown in FIG. 2 is undesirable in the low gain mode in terms of output matching characteristics because the output impedance of the conventional variable gain amplifier shown in FIG. 2 varies depending on whether the gain adjustment unit 231 is turned on or off.

A variable gain amplifier optimized for a high gain mode is highly likely to end up having poor input/output matching characteristics in a low gain mode, while a variable gain amplifier optimized for the low gain mode is highly likely to end up having poor input/output matching characteristics in the high gain mode.

SUMMARY OF THE INVENTION

The present invention provides a variable gain amplifier having stable input/output matching characteristics.

The above stated object as well as other objects, features and advantages, of the present invention will become clear to those skilled in the art upon review of the following description.

According to an aspect of the present invention, there is provided a variable gain amplifier including a first cascode amplifier which comprises a first common source transistor and a first common gate transistor, a second cascode amplifier which forms a differential pair with the first cascode amplifier and comprises a second common source transistor and a second common gate transistor, and a gain adjustment unit having a side connected to the drain of the first common source transistor and the source of the first common gate transistor and another side connected to the drain of the second common source transistor and the source of the second common gate transistor.

According to another aspect of the present invention, there is provided a variable gain amplifier including a first cascode amplifier which comprises a first common source transistor, a first common gate transistor, and a third common gate transistor, a second cascode amplifier which forms a differential pair with the first cascode amplifier and comprises a second common source transistor, a second common gate transistor, and a fourth common gate transistor, a first gain adjustment unit having a side connected to the drain of the first common source transistor and the source of the first common gate transistor and another side connected to the drain of the second common source transistor and the source of the second common gate transistor, and a second gain adjustment unit having a side connected to the drain of the first common gate transistor and the source of the third common gate transistor and another side connected to the drain of the second common gate transistor and the source of the fourth common gate transistor.

According to still another aspect of the present invention, there is provided a variable gain amplifier including a first cascode amplifier which comprises a first common source transistor, a first common gate transistor, and a third common gate transistor, a second cascode amplifier which forms a differential pair with the first cascode amplifier and comprises a second common source transistor, a second common gate transistor, and a fourth common gate transistor, a first gain adjustment unit having a side connected to the drain of the first common source transistor and the source of the first common gate transistor and another side connected to the drain of the second common gate transistor and the source of the fourth common gate transistor, and a second gain adjustment unit having a side connected to the drain of the first common gate transistor and the source of the third common gate transistor and another side connected to the drain of the second common source transistor and the source of the second common gate transistor.

According to a further aspect of the present invention, there is provided a variable gain amplifier including a first composite cascode amplifier which comprises a common source transistor and a plurality of common gate transistors, a second composite cascode amplifier which forms a differential pair with the first composite cascode amplifier and comprises a common source transistor and a plurality of common gate transistors, and a plurality of gain adjustment units each having a side connected to a drain-source connection of the first composite cascode amplifier and another side connected to a drain-source connection of the second composite cascode amplifier.

According to yet another aspect of the present invention, there is provided a variable gain amplifier including a composite cascode amplifier which comprises a common source transistor and a plurality of common gate transistors, and a plurality of gain adjustment units each having a side connected to a drain-source connection of the composite cascode amplifier and another side grounded.

BRIEF DESCRIPTION OF THE DRAWINGS

The above and other aspects of the present invention will become more apparent by describing in detail preferred embodiments thereof with reference to the attached drawings in which:

FIGS. 5A-5D illustrate the variations of S-parameters indicating the input/output matching characteristics of the variable gain amplifier shown in FIG. 4;

DETAILED DESCRIPTION OF EXEMPLARY EMBODIMENTS OF THE INVENTION

Aspects of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the present invention will only be defined by the appended claims.

The present invention will now be described more fully with reference to the accompanying drawings, in which exemplary embodiments of the invention are shown.

Figure 4:
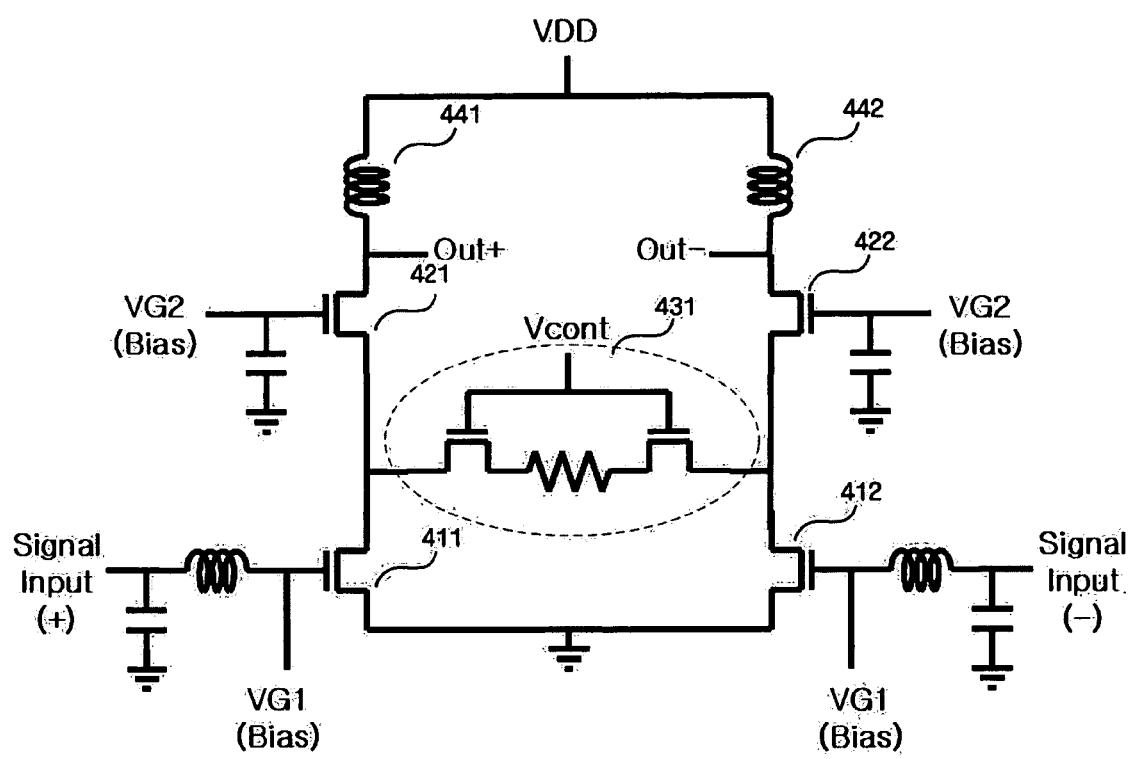
FIG. 4 is a circuit diagram of a variable gain amplifier according to an exemplary embodiment of the present invention.

FIG. 4 is a circuit diagram of a variable gain amplifier according to an exemplary embodiment of the present invention.

Referring to FIG. 4, the variable gain amplifier has a differential cascode amplifier structure including a differential pair of cascode amplifiers, i.e., first and second cascode amplifiers, and also has an LC matching structure for input/output matching.

The first cascode amplifier includes a first common source transistor 411 and a first common gate transistor 421, and the second cascode amplifier includes a second common source transistor 412 and a second common gate transistor 422.

The general operation of a cascode amplifier will now be described in detail. A common source transistor amplifies a signal input to the cascode amplifier. However, the frequency response characteristics of the common source transistor may deteriorate in a high frequency range due to Miller's effect. If a common gate transistor is connected to an output terminal (i.e., a drain) of the common source transistor, the frequency response characteristics of the common source transistor may improve. Accordingly, a cascode amplifier in which a common gate transistor having more desirable frequency response characteristics in a high frequency range than a common source transistor is connected to the common source transistor is widely used.

In the present exemplary embodiment, a variable gain amplifier is designed to have a differential cascode amplifier structure including a differential pair of cascode amplifiers that are symmetric. However, in the present embodiment, a gain adjustment unit 431 is connected between the inside of the first cascode amplifier and the inside of the second cascode amplifier instead of between output terminals Out+ and Out− of the first and second cascode amplifiers, while the gain adjustment unit 231 is directly connected to the output terminals Out+ and Out− of the conventional variable gain amplifier shown in FIG. 2.

A bias voltage VG1 and a positive signal (+) received via a signal input terminal are applied to the gate of the first common source transistor 411. The bias voltage VG1 and a negative signal (−) received via another signal input terminal are applied to the gate of the second common source transistor 412. A capacitor and an inductor are connected between the first common source transistor 411 and the signal input terminal via which the positive signal (+) is received and between the second common source transistor 412 and the signal input terminal via which the negative signal (−) is received.

The source of the first common gate transistor 421 and one side of the gain adjustment unit 431 are connected to the drain of the first common source transistor 411. The source of the second common gate transistor 422 and the other side of the gain adjustment unit 431 are connected to the drain of the second common source transistor 412. The gain adjustment unit 431 includes two transistors that serve as switches and a resistor. The turning on or off of the two transistors is controlled by a gate voltage Vcont applied to the two transistors, and the output impedance of the variable gain amplifier varies depending on whether the two transistors are turned on or off.

A bias voltage VG2 is applied to the gate of the first common gate transistor 421 and the gate of the second common gate transistor 422. Capacitors connected to the gates of the first and second common gate transistors 421 and 422 are used to ground alternating current (AC) components that may be included in the bias voltage VG2.

The drain of the first common gate transistor 421 is connected to the output terminal Out+ via which the positive signal (+) is output, and the drain of the second common gate transistor 422 is connected to the output terminal Out− via which the negative signal (−) is output. Inductors 441 and 442 are used for matching the outputs of the output terminals Out+ and Out−. Even though not illustrated in FIG. 4, a capacitor may also be connected to each of the output terminals Out+ and Out− for further matching the outputs of the output terminals Out+ and Out−.

Figure 1:
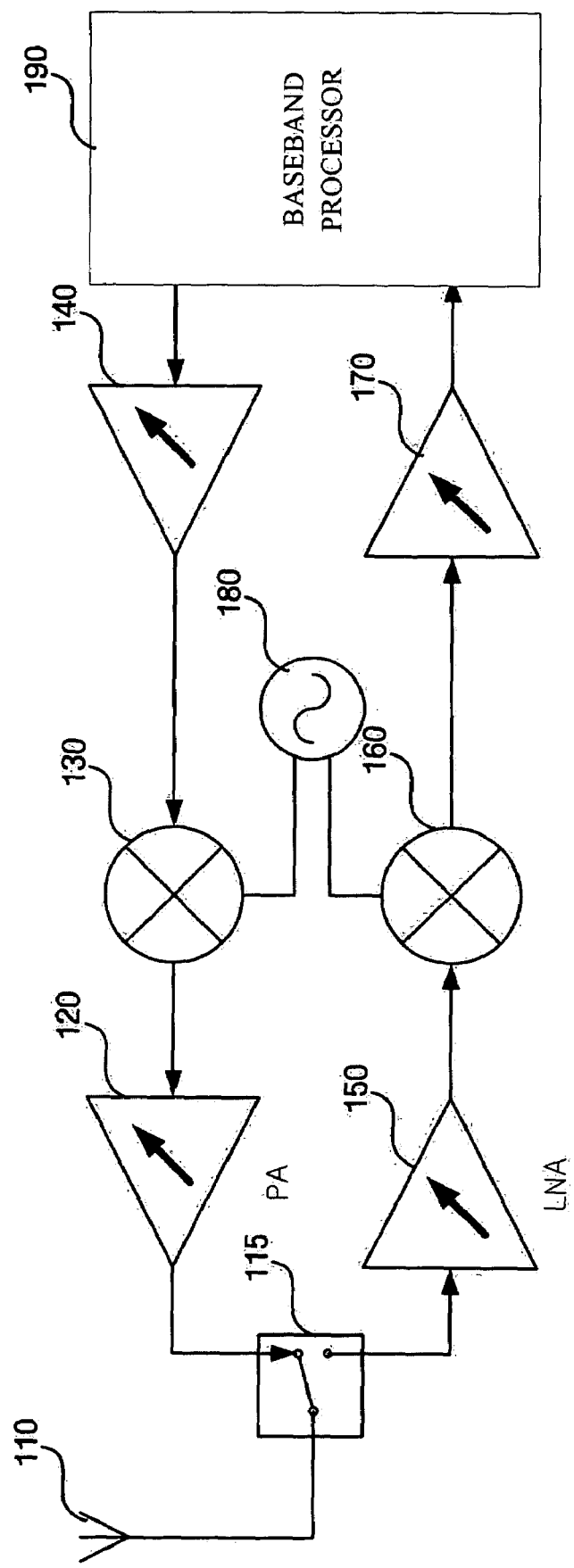
FIG. 1 is a circuit diagram of a wireless communication apparatus.
Figure 2:
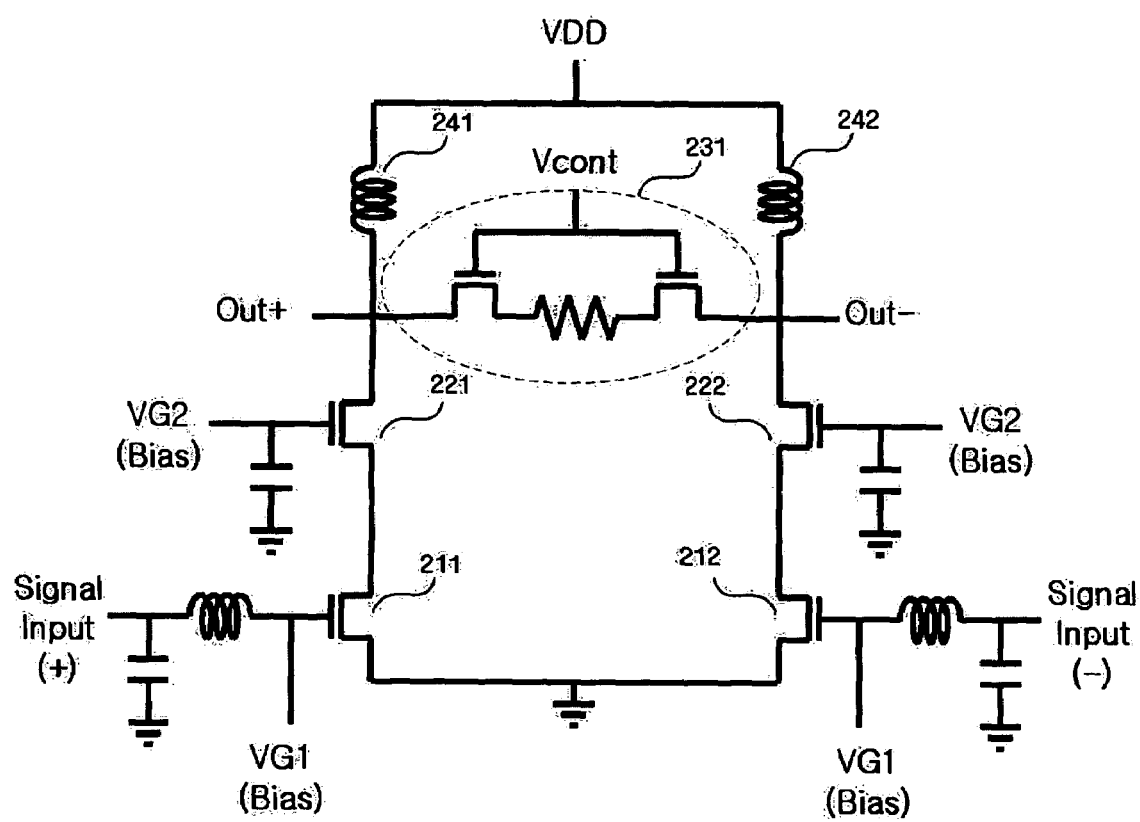
FIG. 2 is a circuit diagram of a conventional variable gain amplifier.
Figure 3B:
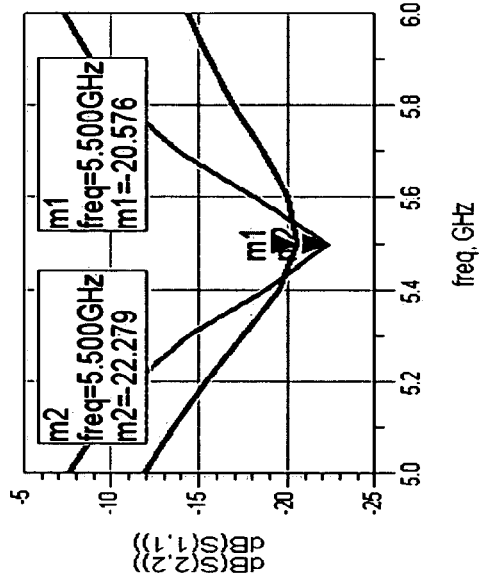
FIGS. 3A-3D illustrate the variations of the values of S-parameters indicating the input/output matching characteristics of the conventional variable gain amplifier shown in FIG. 2.
Figure 3D:
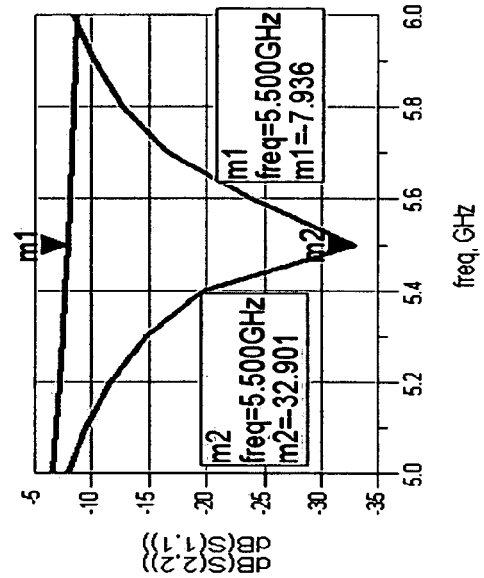
Figure 3A:
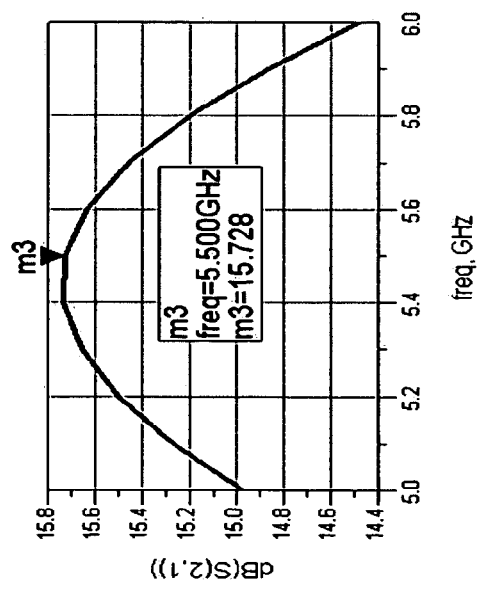
Figure 3C:
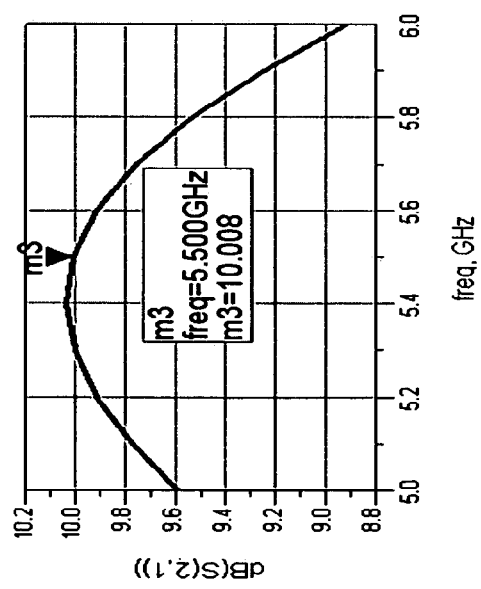

The gain adjustment unit 431, unlike the gain adjustment unit 231 of the conventional variable gain amplifier shown in FIG. 2, is not connected between the output terminals Out+ and Out− of the first and second cascode amplifiers but connected between the inside of the first cascode amplifier and the inside of the second cascode amplifier. Accordingly, the variable gain amplifier generally has more desirable input/output matching characteristics (particularly, much more desirable output matching characteristics) than the conventional variable gain amplifier shown in FIG. 2. The improved input/output matching characteristics of the variable gain amplifier shown in FIG. 4 will now be described in further detail with reference to FIGS. 5A–5D.

FIGS. 5A–5D illustrate the variations of S-parameters S11, S21, and S22 indicating the input/output matching characteristics of the variable gain amplifier shown in FIG. 4.

Referring to FIGS. 5A–5D, in a high gain mode, the S-parameters S11, S21, and S22 of the variable gain amplifier shown in FIG. 4 have the same values as the respective S-parameters S11, S21, and S22 of the conventional variable gain amplifier shown in FIG. 2 because, in the high gain mode, both the gain adjustment unit 431 and the gain adjustment unit 231 are turned off.

In a low gain mode, the value of the S-parameter S21 of the variable gain amplifier shown in FIG. 4 is not much different from the value of the S-parameter S21 of the conventional variable gain amplifier shown in FIG. 2. However, the S-parameter S22 of the variable gain amplifier shown in FIG. 4 has a value of −20.438 dB, while the S-parameter S22 of the conventional variable gain amplifier shown in FIG. 2 has a value of −7.936 dB. The S-parameter S11 of the variable gain amplifier shown in FIG. 4 has a value of −20.438 dB, while the S-parameter S11 of the conventional variable gain amplifier shown in FIG. 2 has a value of −32.901 dB. In short, the variable gain amplifier shown in FIG. 4 has more desirable output matching characteristics but less desirable input matching characteristics than the conventional variable gain amplifier shown in FIG. 2. In detail, a variable gain amplifier having desirable input/output matching characteristics has an S-parameter value not higher than −15 dB. Since the S-parameter S11 of the conventional variable gain amplifier shown in FIG. 2 in the low gain mode is lower than −15 dB, the conventional variable gain amplifier shown in FIG. 2 is considered to have desirable input matching characteristics in the low gain mode. However, since the S-parameter S22 of the conventional variable gain amplifier shown in FIG. 2 in the low gain mode is not lower than −15 dB, the conventional variable gain amplifier shown in FIG. 2 is considered to have poor output matching characteristics in the low gain mode.

On the other hand, the variable gain amplifier shown in FIG. 4 has more desirable input/output matching characteristics in the low gain mode than the conventional variable gain amplifier shown in FIG. 2 and thus is expected to have a wider gain adjustment range than the conventional variable gain amplifier shown in FIG. 2.

Figure 6:
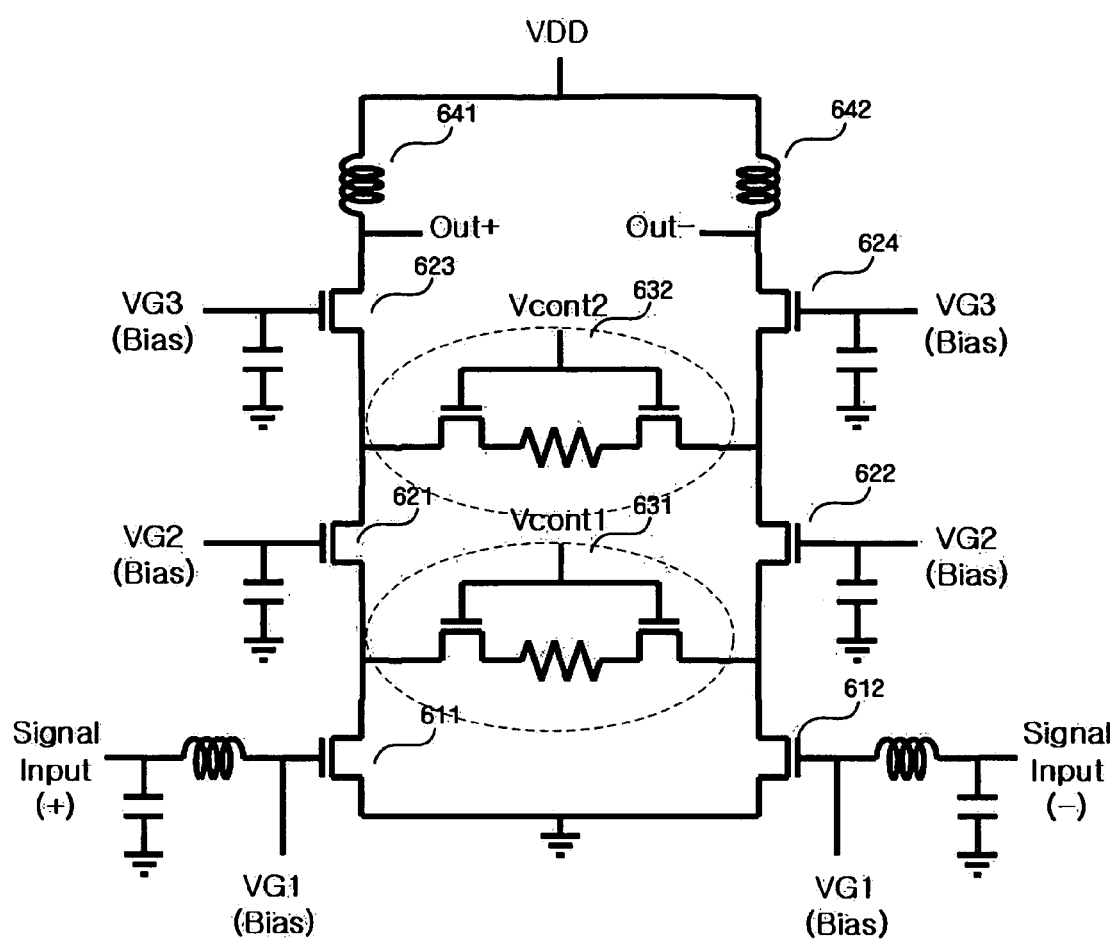
FIG. 6 is a circuit diagram of a variable gain amplifier according to another exemplary embodiment of the present invention.
Figure 7A:
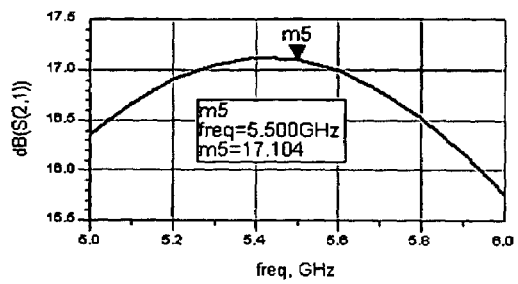
FIGS. 7A-7H illustrate the variations of S-parameters indicating the input/output matching characteristics of the variable gain amplifier shown in FIG. 6.
Figure 7B:
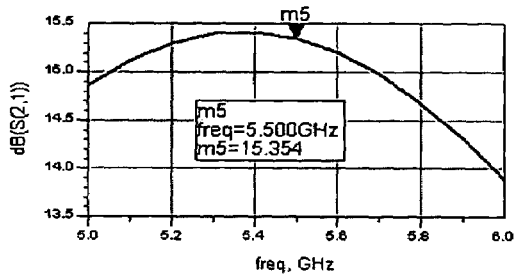
Figure 7C:
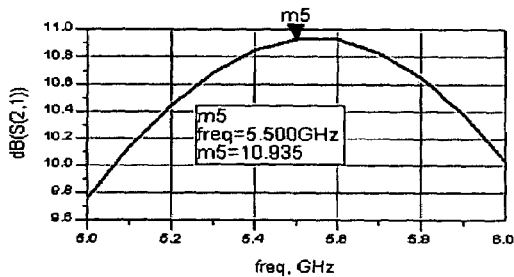
Figure 7D:
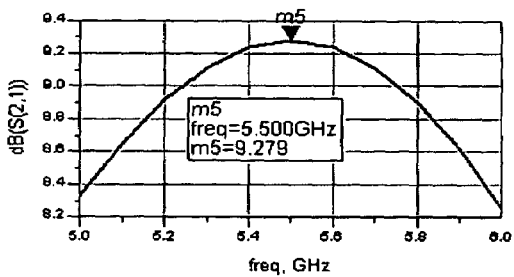
Figure 7E:
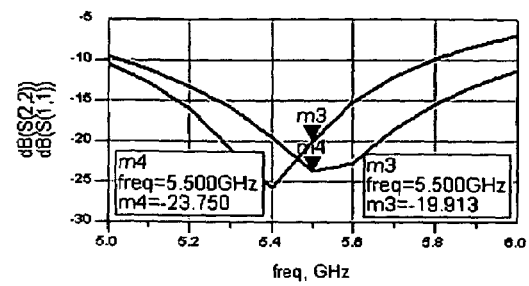
Figure 7F:
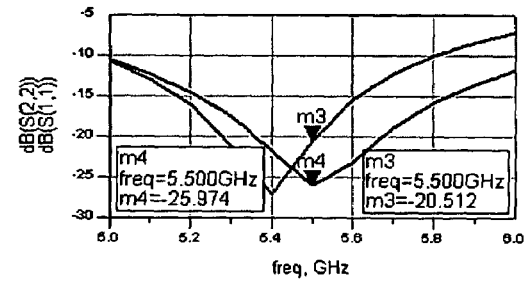
Figure 7G:
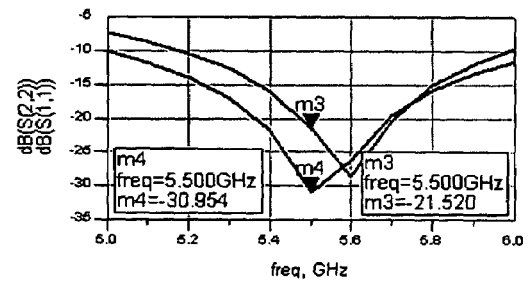
Figure 7H:
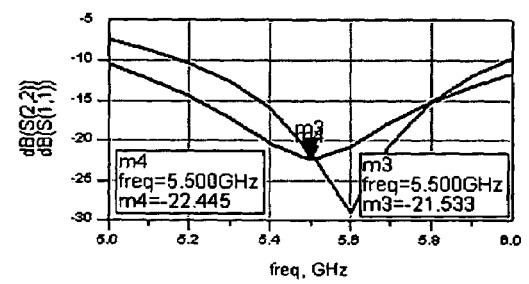

FIG. 6 is a circuit diagram of a variable gain amplifier according to another exemplary embodiment of the present invention.

Referring to FIG. 6, the variable gain amplifier uses a composite cascode amplifier structure including first and second cascode amplifiers, instead of the differential cascode amplifier structure used by the variable gain amplifier shown in FIG. 4. In the composite cascode amplifier structure, a plurality of common gate amplifiers are connected to a common source transistor.

In detail, the first cascode amplifier includes a common transistor 611 and two common gate transistors 621 and 623. The second cascode amplifier includes a common source transistor 612 and two common gate transistors 622 and 624.

The source of the first common gate transistor 621 and one side of a first gain adjustment unit 631 are connected to the drain of the first common source transistor 611. The source of the second common gate transistor 622 and the other side of the first gain adjustment unit 631 are connected to the drain of the second common source transistor 612. The source of the third common gate transistor 623 and one side of a second gain adjustment unit 632 are connected to the drain of the first common gate transistor 621. The source of the fourth common gate transistor and the other side of the second gain adjustment unit 632 are connected to the drain of the second common gate transistor 622.

Each of the first and second gain adjustment units 631 and 632 includes two transistors that serve as switches and a resistor. The turning on or off of the two transistors is controlled by gate voltages Vcont1 and Vcont2 respectively applied to the two transistors. The output impedance of the variable gain amplifier shown in FIG. 6 varies depending on whether the two transistors of each of the first and second gain adjustment units 631 and 632 are turned on or off.

The variable gain amplifier shown in FIG. 6 can control gain more delicately than the variable gain amplifier shown in FIG. 4. The input/output matching characteristics of the variable gain amplifier shown in FIG. 6 will now be described in detail with reference to FIG. 7.

FIGS. 7A-7H illustrate the variations of S-parameters S11, S21, and S22 indicating the input/output matching characteristics of the variable gain amplifier shown in FIG. 4.

Specifically, FIGS. 7A-7D illustrate the variations of the S-parameter S21, and FIGS. 7E-7H illustrate the variations of the S-parameters S11 and S22. In addition, FIGS. 7A, 7B, 7E and 7F illustrate the variations of the S-parameters S11, S21, and S22 in a high gain mode, and FIGS. 7C, 7D, 7G and 7H illustrate the variations of the S-parameters S11, S21, and S22 in a low gain mode.

Referring to FIG. 7, the S-parameter S21 may have a value between 17.104 dB and 9.279 dB depending on whether the variable gain amplifier shown in FIG. 6 is in the high gain mode or the low gain mode. In detail, the S-parameter S21 of the variable gain amplifier shown in FIG. 6 is 1.376 dB (=17.104−15.728) higher than the S-parameter S21 of the variable gain amplifier shown in FIG. 4 when gain is maximized. On the other hand, the S-parameter S21 of the variable gain amplifier shown in FIG. 6 is −0.763 dB (=9.279−10.042) lower than the S-parameter S21 of the variable gain amplifier shown in FIG. 4 when gain is minimized.

In conclusion, the variable gain amplifier shown in FIG. 6 results in a higher gain than the variable gain amplifier shown in FIG. 4 and provides four gain adjustment steps. In addition, the variable gain amplifier shown in FIG. 6 has a wider gain adjustment range and more desirable input/output matching characteristics than the variable gain amplifier shown in FIG. 4.

Figure 8:
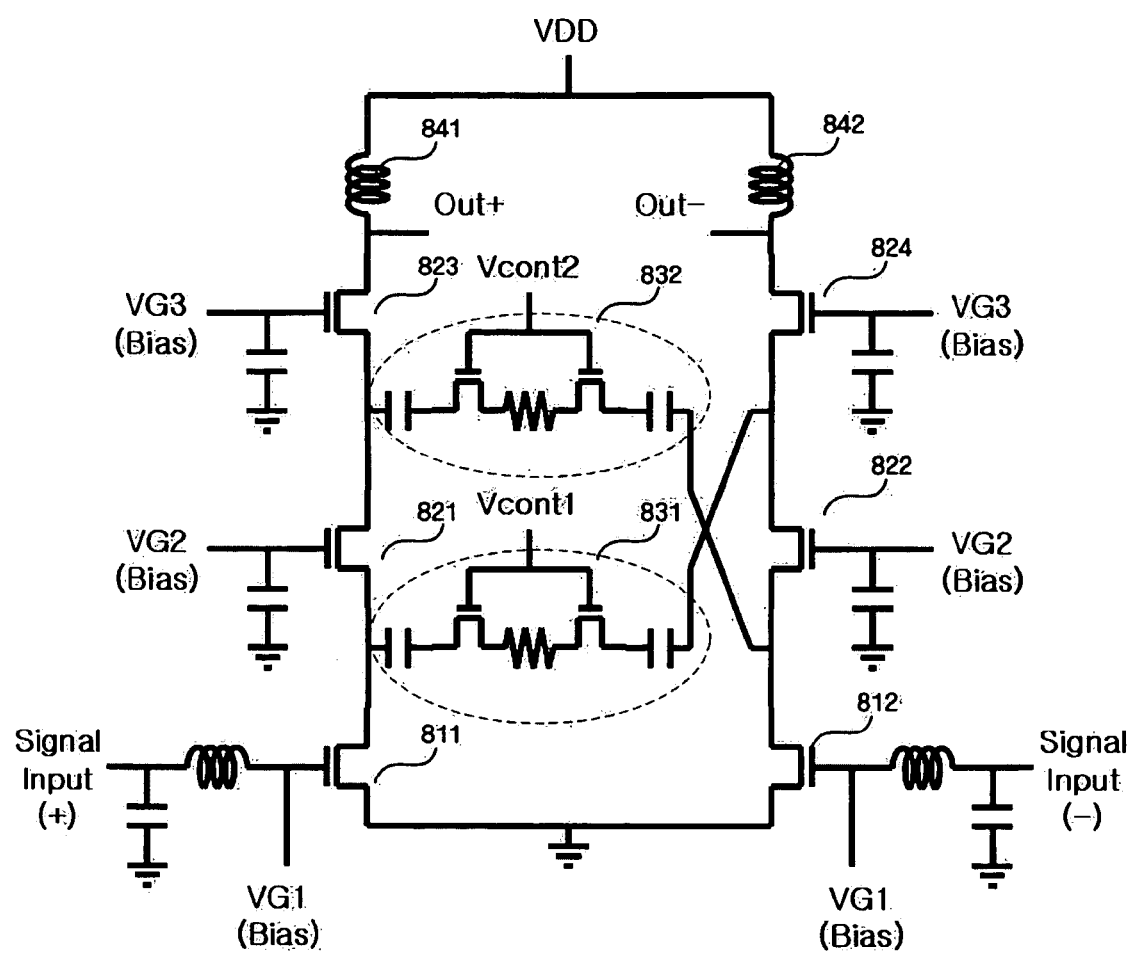
FIG. 8 is a circuit diagram of a variable gain amplifier according to still another exemplary embodiment of the present invention.
Figure 9A:
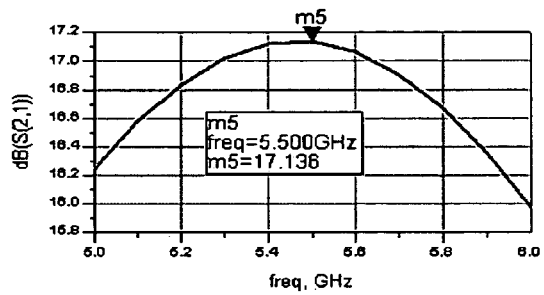
FIGS. 9A-9F illustrate the variations of S-parameters indicating the input/output matching characteristics of the variable gain amplifier shown in FIG. 6.
Figure 9D:
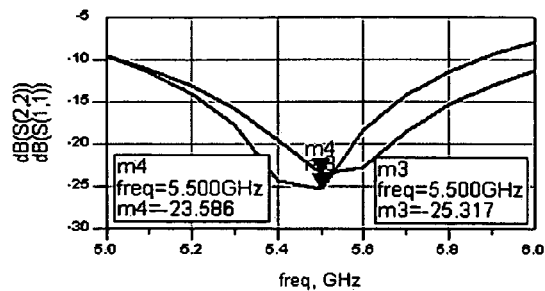
Figure 9B:
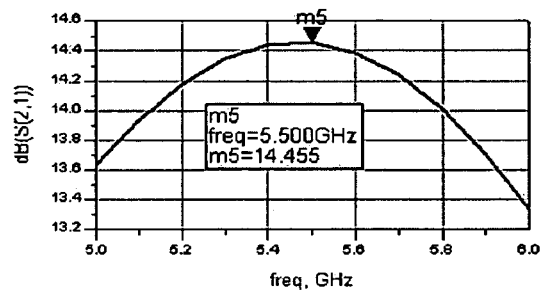
Figure 9E:
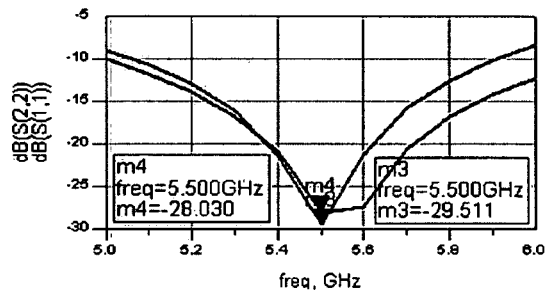
Figure 9C:
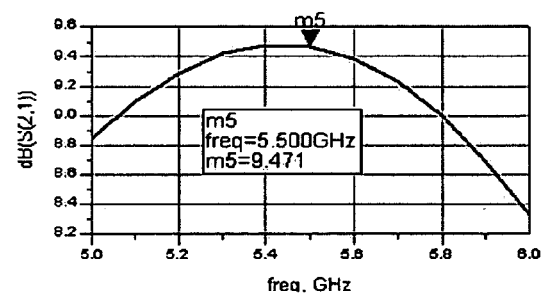
Figure 9F:
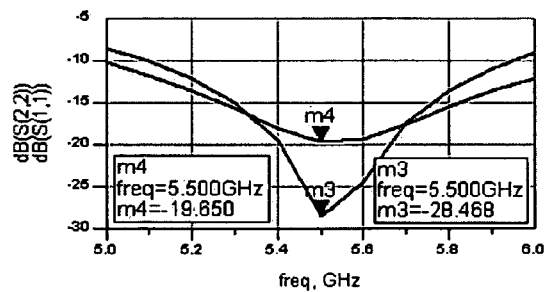

FIG. 8 is a circuit diagram of a variable gain amplifier according to another exemplary embodiment of the present invention.

Referring to FIG. 8, the variable gain amplifier is different from the variable gain amplifier shown in FIG. 6 in terms of where in the variable gain amplifier first and second gain adjustment units 831 and 832 are connected.

A first cascode amplifier of the variable gain amplifier includes a common source transistor 811 and two common gate transistors 821 and 823. A second cascode amplifier of the variable gain amplifier includes a common source transistor 812 and two common gate transistors 822 and 824.

The source of the first common gate transistor 821 and one side of the first gain adjustment unit 831 are connected to the drain of the first common source transistor 811. The source of the second common gate transistor 822 and one side of the second gain adjustment unit 832 are connected to the drain of the second common source transistor 812. The source of the third common gate transistor 823 and the other side of the second gain adjustment unit 832 are connected to the drain of the first common gate transistor 821. The source of the fourth common gate transistor 824 and the other side of the first gain adjustment unit 831 are connected to the drain of the second common gate transistor 822.

Each of the first and second gain adjustment units 831 and 832 includes two transistors that serve as switches and a resistor. The turning on or off of the two transistors is controlled by gate voltages Vcont1 and Vcont2 applied to the two transistors. The output impedance of the variable gain amplifier varies depending on whether the two transistors of each of the first and second gain adjustment units 831 and 832 are turned on or off.

The input/output matching characteristics of the variable gain amplifier shown in FIG. 8 will now be described in detail with reference to FIGS. 9A-9F.

FIGS. 9A-9F illustrate the variations of S-parameters indicating the input/output matching characteristics of the variable gain amplifier shown in FIG. 8.

Referring to FIGS. 9A-9F, the variable gain amplifier shown in FIG. 8 provides three gain adjustment steps because an occasion when the first gain adjustment unit 831 is turned off and the second gain adjustment 832 is turned on is basically the same as an occasion when the first gain adjustment unit 831 is turned on and the second gain adjustment unit 832 is turned off.

As shown in FIGS. 9A-9F, the matching center frequency of the S-parameter S11 of the variable gain amplifier barely moves while the matching center frequency of the S-parameter S11 of the variable gain amplifier shown in FIG. 7 moves by about 200 MHz. In addition, the gain adjustment range of the variable gain amplifier shown in FIG. 8 is almost as wide as the gain adjustment range of the variable gain amplifier shown in FIG. 6. In addition, as illustrated in FIGS. 9A-9F, the variable gain amplifier shown in FIG. 8 has superior input/output matching characteristics.

The variable gain amplifier according to an exemplary embodiment of the present invention has been described above as including a gain adjustment unit in a cascode amplifier, but the present invention is not restricted thereto.

Figure 10:
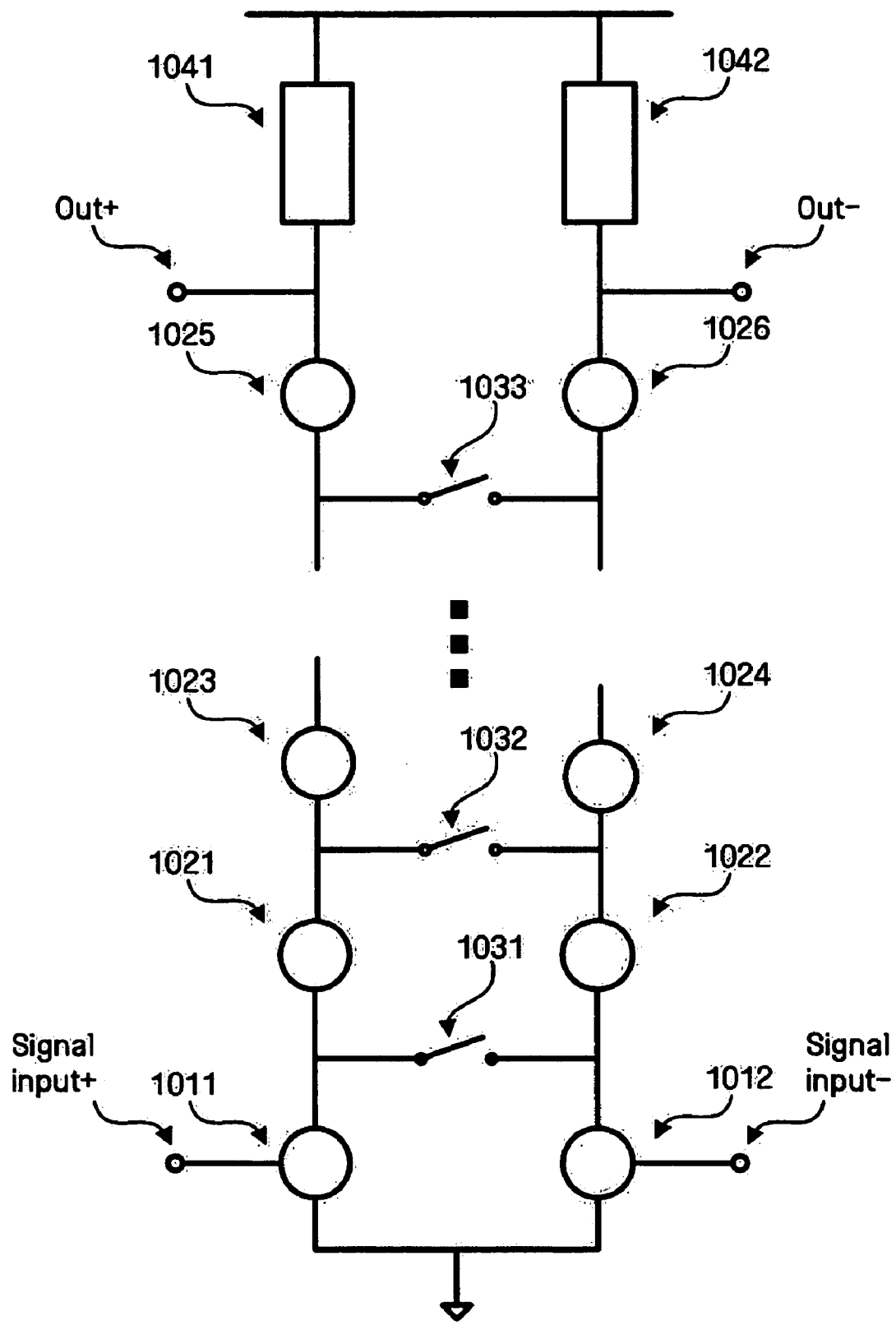
FIGS. 10 through 12 are circuit diagrams of variable gain amplifiers according to other exemplary embodiments of the present invention.
Figure 11:
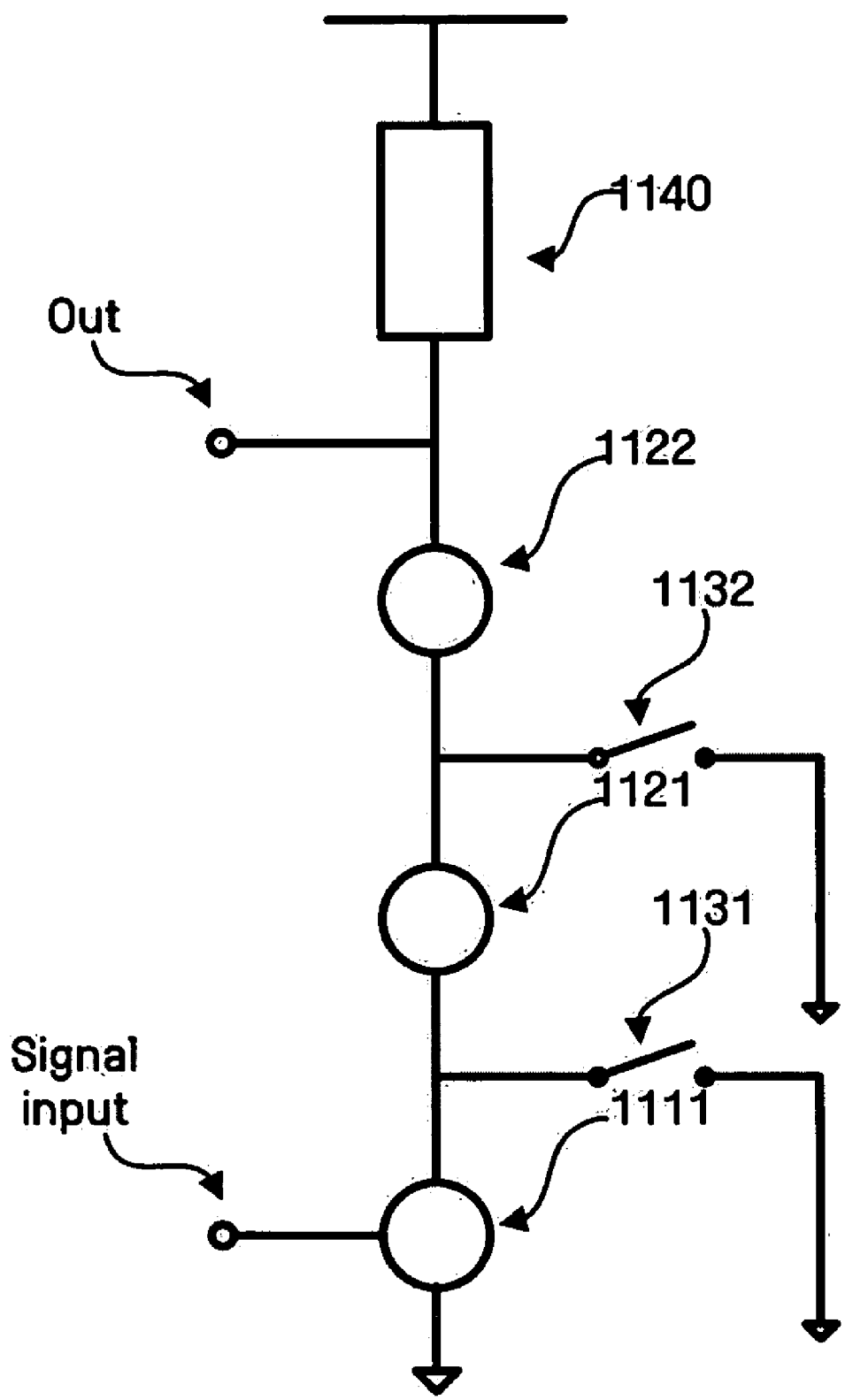
Figure 12:
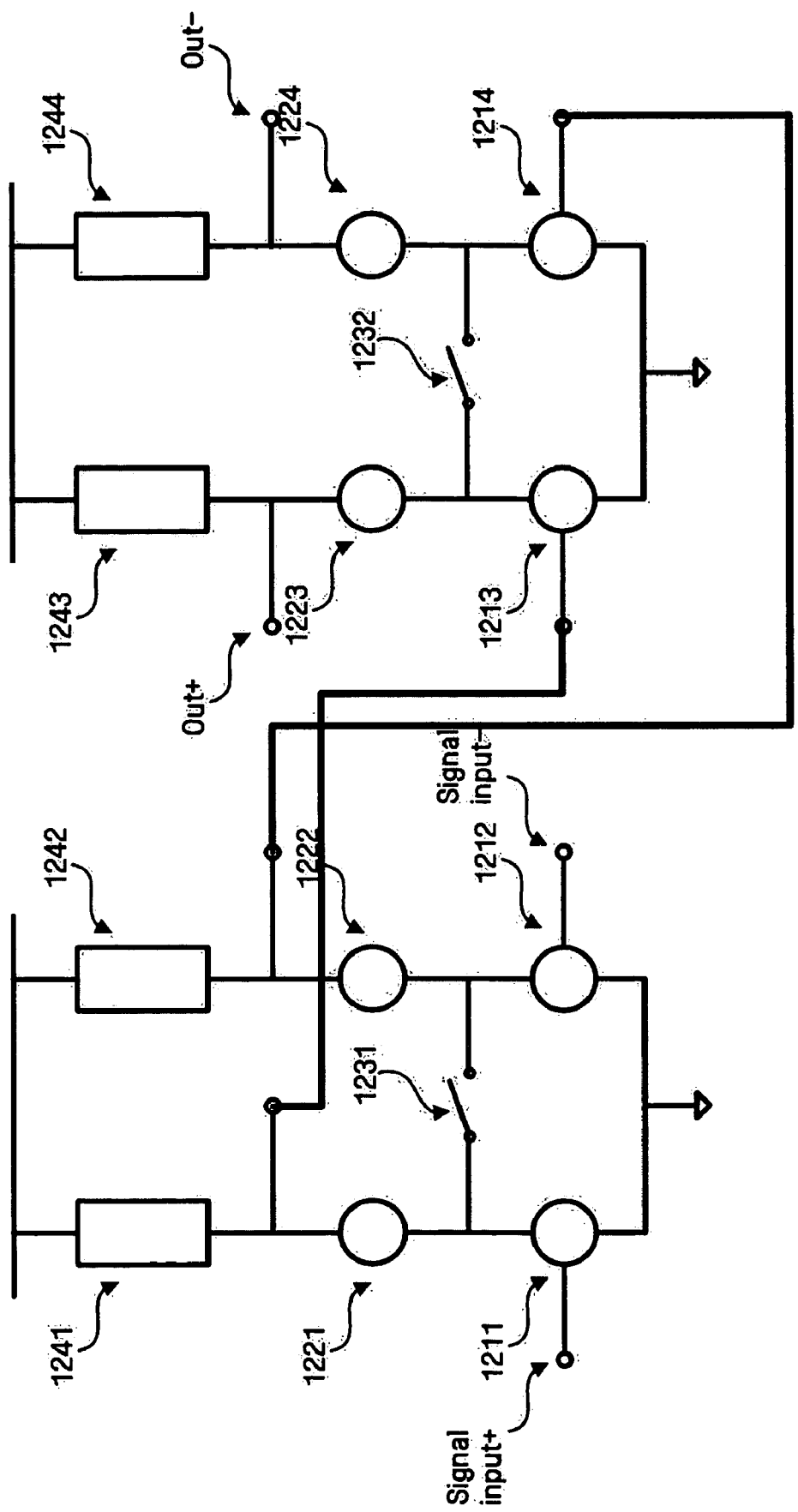

FIGS. 10 through 12 are circuit diagrams of variable gain amplifiers according to other exemplary embodiments of the present invention.

Specifically, FIG. 10 is a circuit diagram of a variable gain amplifier having a differential pair of composite cascode amplifiers, i.e., a first composite cascode amplifier and a second composite cascode amplifier.

Referring to FIG. 10, a drain-source connection of the first composite cascode amplifier of the variable gain amplifier is connected to a drain-source connection of the second composite cascode amplifier of the variable gain amplifier.

The first composite cascode amplifier includes a first common source transistor 1011 and a plurality of common gate transistors, i.e., a first common gate transistor 1021, a third common gate transistor 1023, and a fifth common gate transistor 1025. The second composite cascode amplifier includes a second common source transistor 1012 and a plurality of common gate transistors, i.e., a second common gate transistor 1022, a fourth common gate transistor 1024, and a sixth common gate transistor 1026.

The source of the first common gate transistor 1021 and one side of a first gain adjustment unit 1031 are connected to the drain of the first common source transistor 1011. The source of the second common gate transistor 1022 and the other side of the first gain adjustment unit 1031 are connected to the drain of the second common source transistor 1012. The source of the third common gate transistor 1023 and one side of a second gain adjustment unit 1032 are connected to the drain of the first common gate transistor 1021. The source of the fourth common gate transistor 1024 and another side of the second gain adjustment unit 1032 are connected to the drain of the second common gate transistor 1022. Likewise, one side of a third gain adjustment unit 1033 is connected to the source of the fifth common gate transistor 1025 and the source of the sixth common gate transistor 1026. Impedances 1041 and 1042 are used for output matching.

The embodiment shown in FIG. 10 is provided for illustration only and some of the first through third gain adjustment units 1031, 1032, and 1033 may not be provided. For example, the second gain adjustment unit 1032 may not be included in the structure of the variable gain amplifier shown in FIG. 10. That is, one side of the variable gain amplifier shown in FIG. 10 is connected between the drain of the first common gate transistor 1021 and the source of the third common gate transistor 1023 and the other side of the variable gain amplifier shown in FIG. 10 is connected between the drain of the second common gate transistor 1022 and the source of the fourth common gate transistor 1024.

FIG. 11 is a circuit diagram of a variable gain amplifier without a differential amplifier structure.

Referring to FIG. 11, a signal is input to the gate of a first common source transistor 1111. The source of a first common gate transistor 1121 and one side of a first gain adjustment unit 1131 are connected to the drain of the first common source transistor 1111. The source of a second common gate transistor 1122 and one side of a second gain adjustment unit 1132 are connected to the drain of the first common gate transistor 1121. The signal input to the first common source transistor 1111 is output from the drain of the second common gate transistor 1122. An impedance 1140 is used for output matching. The other sides of the first and second gain adjustment units 1131 and 1132 are grounded.

Each of the first and second gain adjustment units 1131 and 1132 includes one or more transistors that serve as switches and a resistor. A gain adjustment unit included in the variable gain amplifier according to an exemplary embodiment of the present invention has been described above as having two transistors, but the number of transistors included in the gain adjustment unit is not restricted to two. In a case where the variable gain amplifier according to an exemplary embodiment of the present invention is designed to include a differential pair of cascode amplifiers, the cascode amplifiers must be symmetric. However, since the variable gain amplifier shown in FIG. 11 does not adopt the differential amplifier structure, it may not necessarily include a plurality of transistors that will serve as switches. The output impedance of the variable gain amplifier shown in FIG. 11 varies depending on whether the transistors of each of the first and second gain adjustment units 1131 and 1132 are turned on or off.

FIG. 12 is a circuit diagram of a variable gain amplifier comprised of a plurality of differential pairs of amplifiers connected to one another in several stages.

Referring to FIG. 12, the variable gain amplifier includes a plurality of differential pairs of cascode amplifiers connected in two stages, i.e., first and second cascode amplifiers and third and fourth cascode amplifiers.

The first cascode amplifier includes a first common source transistor 1211 and a first common gate transistor 1221. The second cascode amplifier includes a second common source transistor 1212 and a second common gate transistor 1222.

The source of the first common gate transistor 1221 and one side of a first gain adjustment unit 1231 are connected to the drain of the first common source transistor 1211. The source of the second common gate transistor 1222 and the other side of the first gain adjustment unit 1231 are connected to the drain of the second common source transistor 1212.

A signal output from the drain of the first common gate transistor 1221 is input to the third cascode amplifier, and a signal output from the drain of the second common gate transistor 1222 is input to the fourth cascode amplifier. An impedance 1241 is used for matching the impedance of the first cascode amplifier with the impedance of the third cascode amplifier, and an impedance 1242 is used for matching the impedance of the second cascode amplifier with the impedance of the third cascode amplifier.

The third cascode amplifier includes a third common source transistor 1213 and a third common gate transistor 1223. The fourth cascode amplifier includes a fourth common source transistor 1214 and a fourth common gate transistor 1224.

The source of the third common gate transistor 1223 and one side of a second gain adjustment unit 1232 are connected to the drain of the third common source transistor 1213. The source of the fourth common gate transistor 1224 and the other side of the second gain adjustment unit 1232 are connected to the drain of the fourth common source transistor 1214.

A signal output from the drain of the third common gate transistor 1223 is output via a positive signal output terminal Out+, and a signal output from the drain of the fourth common gate transistor 1224 is output via a negative signal output terminal Out−. Impedances 1243 and 1244 are used for output matching.

Figure 13:
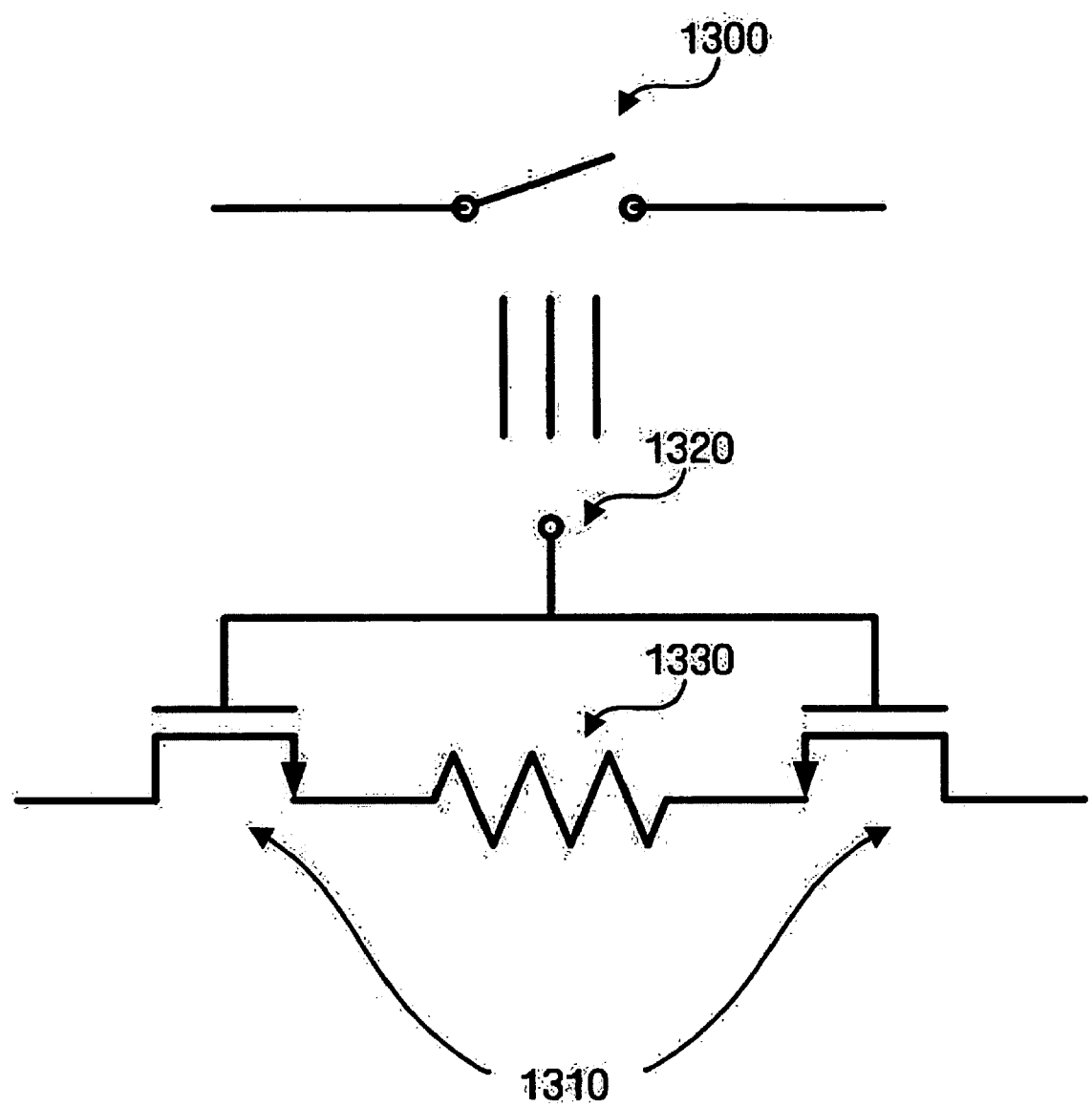
FIG. 13 is a circuit diagram of a gain adjustment unit according to an exemplary embodiment of the present invention.

FIG. 13 is a circuit diagram of a gain adjustment unit 1300 according to an exemplary embodiment of the present invention.

Referring to FIG. 13, the gain adjustment unit 1300 includes a resistor 1330 and a pair 1310 of transistors that serve as switches to turn on or off the gain adjustment unit 1300. One side of the resistor 1330 is connected to the drain of one of the transistors, and the other side of the resistor 1330 is connected to the source of the other transistor. A control bias voltage is applied to a gate terminal 1320 of the transistors 1310. Thus, the transistors 1310 are turned on or off in response to the control bias voltage applied thereto.

Figure 14:
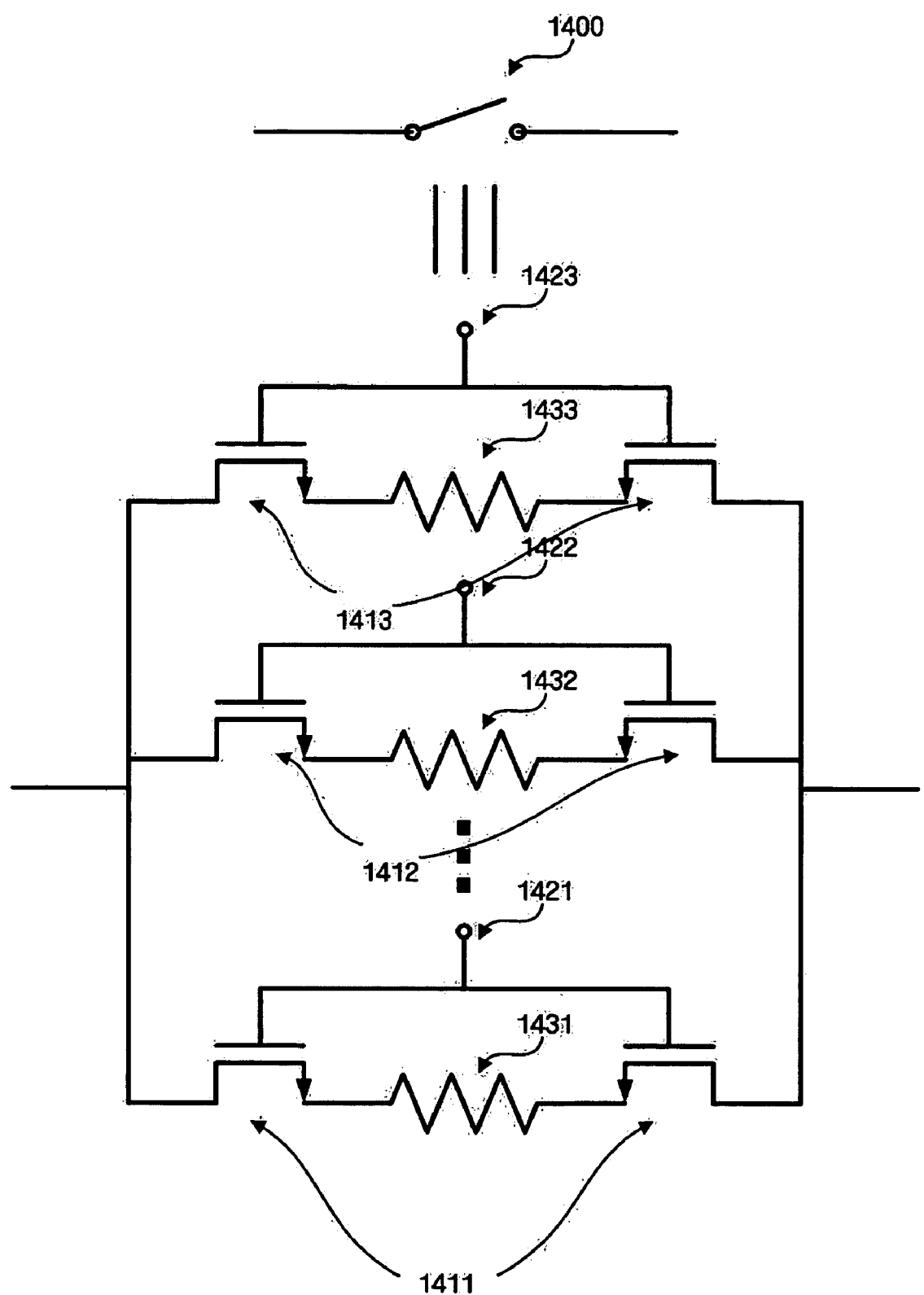
FIG. 14 is a circuit diagram of a gain adjustment unit according to another exemplary embodiment of the present invention.

FIG. 14 is a circuit diagram of a gain adjustment unit 1400 according to another exemplary embodiment of the present invention.

Referring to FIG. 14, the gain adjustment unit 1400 includes a plurality of resistors 1431, 1432, and 1433 and a plurality of pairs 1411, 1412, and 1413 of transistors. The resistors 1431, 1432, and 1433 may have different resistance values from one another. Alternatively, all or some of the resistors 1431, 1432, and 1433 may have the same resistance value. The turning on or off of each of the pairs 1411, 1412, and 1413 of transistors is controlled using a control bias voltage applied at gate terminals 1421, 1422, and 1423 to each respective pair 1411, 1412, and 1413 of transistors.

The gain adjustment unit 1400 can provide delicate gain adjustment stages by using such a resistor-ladder structure.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, the exemplary embodiments of the present invention provide a variable gain amplifier including NMOS transistors, but the variable gain amplifier may include PMOS transistors or both NMOS and PMOS transistors. In addition, the exemplary embodiments of the present invention provide a gain adjustment unit including a pure resistor, but the gain adjustment unit may include a component with an impedance having reactive components. Therefore, those skilled in the art will appreciate that the disclosed exemplary embodiments of the invention are used in a generic and descriptive sense only and not for purposes of limitation and that many variations and modifications can be made to the exemplary embodiments without substantially departing from the principles of the present invention.

Accordingly, it is possible to realize a variable gain amplifier having stable input/output matching characteristics and providing a wide gain control range.

What is claimed is:

1. A variable gain amplifier, comprising:
   a first cascode amplifier which comprises a first common source transistor, a first common gate transistor, and a third common gate transistor;
   a second cascode amplifier which forms a differential pair with the first cascode amplifier and comprises a second common source transistor, a second common gate transistor, and a fourth common gate transistor;
   a first gain adjustment unit having a side coupled to a drain of the first common source transistor and a source of the first common gate transistor and another side coupled to a drain of the second common source transistor and a source of the second common gate transistor; and
   a second gain adjustment unit having a side coupled to a drain of the first common gate transistor and a source of the third common gate transistor and another side coupled to a drain of the second common gate transistor and a source of the fourth common gate transistor.

2. The variable gain amplifier of claim 1, wherein the gain adjustment unit comprises a pair of transistors that are turned on or off in response to a control bias voltage and a resistor.

3. The variable gain amplifier of claim 1, wherein the gain adjustment unit comprises a plurality of pairs of transistors that are turned on or off in response to a control bias voltage and a plurality of resistors connected to the plurality of pairs of transistors, respectively.

4. A variable gain amplifier, comprising:
   a first cascode amplifier which comprises a first common source transistor, a first common gate transistor, and a third common gate transistor;
   a second cascode amplifier which forms a differential pair with the first cascode amplifier and comprises a second common source transistor, a second common gate transistor, and a fourth common gate transistor;
   a first gain adjustment unit having a side coupled to a drain of the first common source transistor and a source of the first common gate transistor and another side coupled to a drain of the second common gate transistor and a source of the fourth common gate transistor; and
   a second gain adjustment unit having a side coupled to a drain of the first common gate transistor and a source of the third common gate transistor and another side coupled to a drain of the second common source transistor and a source of the second common gate transistor.

5. The variable gain amplifier of claim 4, wherein the first and second gain adjustment units comprise a pair of transistors that are turned on or off in response to a control bias voltage and a resistor, respectively.

6. The variable gain amplifier of claim 4, wherein the first and second gain adjustment units comprise a plurality of pairs of transistors that are turned on or off in response to a control bias voltage and a plurality of resistors connected to the plurality of pairs of transistors, respectively.

7. A variable gain amplifier, comprising:
   a first composite cascode amplifier which comprises a common source transistor and a plurality of common gate transistors;
   a second composite cascode amplifier which forms a differential pair with the first composite cascode amplifier and comprises a common source transistor and a plurality of common gate transistors; and
   a plurality of gain adjustment units each having a side coupled to a drain-source connection of the first composite cascode amplifier and another side coupled to a drain-source connection of the second composite cascode amplifier.

8. The variable gain amplifier of claim 7, wherein the plurality of gain adjustment units comprise pairs of transistors that are turned on or off in response to a control bias voltage and a resistor.

9. The variable gain amplifier of claim 7, wherein the plurality of gain adjustment units comprise a plurality of pairs of transistors that are turned on or off in response to a control bias voltage and a plurality of resistors connected to the respective pairs of transistors.

10. A variable gain amplifier, comprising:
    a composite cascode amplifier which comprises a common source transistor and a plurality of common gate transistors; and
    a plurality of gain adjustment units each having a side coupled to a drain-source connection of the composite cascode amplifier and another side grounded.

11. The variable gain amplifier of claim 10, wherein the plurality of gain adjustment units comprise transistors that are turned on or off in response to control bias voltages and resistors.

* * * * *